(12) United States Patent
Matsunaga et al.

(10) Patent No.: US 7,977,292 B2
(45) Date of Patent: Jul. 12, 2011

(54) CLEANING COMPOSITION AND PROCESS FOR PRODUCING SEMICONDUCTOR DEVICE

(75) Inventors: Hiroshi Matsunaga, Ibaraki (JP); Masaru Ohto, Chiba (JP); Hideo Kashiwagi, Ibaraki (JP); Hiroshi Yoshida, Chiba (JP)

(73) Assignee: Mitsubishi Gas Chemical Company, Inc., Tokyo (JP)

(*) Notice: Subject to any disclaimer, the term of this patent is extended or adjusted under 35 U.S.C. 154(b) by 127 days.

(21) Appl. No.: 12/530,766

(22) PCT Filed: Mar. 6, 2008

(86) PCT No.: PCT/JP2008/054028
§ 371 (c)(1),
(2), (4) Date: Sep. 10, 2009

(87) PCT Pub. No.: WO2008/114616
PCT Pub. Date: Sep. 25, 2008

(65) Prior Publication Data
US 2010/0029085 A1   Feb. 4, 2010

(30) Foreign Application Priority Data
Mar. 16, 2007 (JP) ................................. 2007-067838

(51) Int. Cl.
*C11D 7/18* (2006.01)
(52) U.S. Cl. ..................... 510/175; 510/176; 134/1.3
(58) Field of Classification Search .................. 510/175, 510/176; 134/1.3
See application file for complete search history.

(56) References Cited

U.S. PATENT DOCUMENTS

| | | | |
|---|---|---|---|
| 5,990,060 A | | 11/1999 | Ohmi et al. |
| 6,323,169 B1 | | 11/2001 | Abe et al. |
| 6,686,322 B1 | | 2/2004 | Nohara et al. |
| 7,341,636 B2 | * | 3/2008 | Wang et al. ...................... 134/42 |
| 7,431,775 B2 | * | 10/2008 | Wang et al. ...................... 134/42 |
| 2003/0148624 A1 | | 8/2003 | Ikemoto et al. |
| 2005/0090104 A1 | * | 4/2005 | Yang et al. ...................... 438/689 |
| 2005/0239673 A1 | * | 10/2005 | Hsu ................................. 510/176 |
| 2006/0110690 A1 | | 5/2006 | Haraguchi et al. |
| 2006/0154838 A1 | * | 7/2006 | Hayashida et al. ........... 510/175 |
| 2007/0298619 A1 | | 12/2007 | Yokoi et al. |

(Continued)

FOREIGN PATENT DOCUMENTS

JP   7-245281   9/1995

(Continued)

*Primary Examiner* — Gregory E Webb
(74) *Attorney, Agent, or Firm* — Greenblum & Bernstein, P.L.C.

(57) ABSTRACT

A cleaning composition of a semiconductor device for laminating an organosiloxane-based thin film and a photoresist layer in this order on a substrate having a low dielectric interlayer insulation film and a copper wiring or a copper alloy wiring, then applying selective exposure and development treatments to the subject photoresist layer to form a photoresist pattern, subsequently applying a dry etching treatment to the organosiloxane-based thin film and the low dielectric interlayer insulation film while using this resist pattern as a mask and then removing the organosiloxane-based thin film, a residue generated by the dry etching treatment, a modified photoresist having been modified by the dry etching treatment and an unmodified photoresist layer located in a lower layer than the modified photoresist, the cleaning composition containing from 15 to 20% by mass of hydrogen peroxide, from 0.0001 to 0.003% by mass of an amino polymethylene phosphonic acid, from 0.02 to 0.5% by mass of potassium hydroxide and water and having a pH of from 7.5 to 8.5, is provided. Also, a method for manufacturing a semiconductor device using the subject cleaning composition is provided.

5 Claims, 1 Drawing Sheet

U.S. PATENT DOCUMENTS

2008/0286701 A1 * 11/2008 Rath et al. .................. 430/329

FOREIGN PATENT DOCUMENTS

| JP | 07-245281 | 9/1995 |
| --- | --- | --- |
| JP | 10-298589 | 11/1998 |
| JP | 2000-056478 | 2/2000 |
| JP | 2000-147794 | 5/2000 |
| JP | 2000-258924 | 9/2000 |
| JP | 2001-244228 | 9/2001 |
| JP | 2002-202617 | 7/2002 |
| JP | 2003-005383 | 1/2003 |
| JP | 2003-124173 | 4/2003 |
| JP | 2003-140364 | 5/2003 |
| JP | 2003-221600 | 8/2003 |
| JP | 2003-330205 | 11/2003 |
| JP | 2004-004775 | 1/2004 |
| JP | 2004-029696 | 1/2004 |
| JP | 3516446 | 1/2004 |
| JP | 2004-212818 | 7/2004 |
| JP | 2006-106616 | 4/2009 |
| WO | 00/30162 | 5/2000 |

* cited by examiner

CLEANING COMPOSITION AND PROCESS FOR PRODUCING SEMICONDUCTOR DEVICE

TECHNICAL FIELD

The present invention relates to a cleaning composition for removing an organosiloxane-based thin film on the surface of a material to be treated, a residue generated by drying etching, a modified photoresist having been modified by the dry etching treatment and an unmodified photoresist layer located in a lower layer than the modified photoresist in a manufacturing step of a semiconductor integrated circuit and to a method for manufacturing a semiconductor device using the subject cleaning composition.

BACKGROUND ART

In order to manufacture a highly integrated semiconductor device, first of all, a conductive thin film such as a metal film, etc. which will serve as a wiring material for conduction or an interlayer insulation film for the purpose of insulating conductive thin films from each other is formed on a device such as a silicon wafer, etc. Thereafter, a photoresist is uniformly coated on the surface of this conductive thin film or interlayer insulation film to provide a photosensitive layer, to which is then applied selective exposure and development treatments to prepare a desired resist pattern. Subsequently, a dry etching treatment is applied to the interlayer insulation film while using this resist pattern as a mask, thereby forming a desired pattern on the subject thin film. Then, there is generally adopted a series of steps of completely removing the resist pattern and a residue generated due to the dry etching treatment by means of ashing with oxygen plasma, etc. or using a prescribed cleaning liquid.

In recent years, miniaturization of a design rule advances so that signal transmission delay dominates the limits of high-speed arithmetic processing. For that reason, transition from aluminum to copper with lower electrical resistance as the wiring material for conduction is advancing. Also, transition from a silicon oxide film to a low dielectric interlayer insulation film having a dielectric constant of lower than 3 (hereinafter sometimes referred to as "Low-k film") as the interlayer insulation film is advancing. For example, an organosiloxane thin film containing a light absorbing compound (hereinafter referred to as "organosiloxane-based thin film") having (1) a function to fill in gaps such as projections and recesses, grooves, etc. of a base element to achieve flattening, (2) a function to absorb radiations reflected from the device or (3) a function to keep the shape of the interlayer insulation film at the time of dry etching to make it easy to achieve precise microfabrication has been provided between the photoresist and the interlayer insulation film.

However, in the case of removing the photoresist or the organosiloxane-based thin film by means of ashing, there is a concern that the Low-k film existing beneath the organosiloxane-based thin film is exposed to oxygen plasma or the like and damaged. For example, in the pattern formation by a via-first dual damascene process, in removing the organosiloxane-based thin film filled in a via part, the Low-k film in the surroundings of the via part is damaged. As a result, there is caused a problem that an electric characteristic is conspicuously deteriorated. Accordingly, in manufacturing a semiconductor device in which the Low-k film is used, there is demanded a method of exhibiting photoresist removal properties to the same extent as that in an oxygen plasma ashing step while suppressing the damage of the subject Low-k film and capable of removing the photoresist by other means than ashing.

As a method for solving these problems, there are proposed methods of pre-treating with a hydrogen peroxide-containing cleaning liquid and treating with an amine-based stripping liquid (see Japanese Patent No. 3516446, JP-A-2003-140364 and JP-A-2006-106616). However, these treatment methods are a two-stage process, and more simplification of the process is desired. For that reason, there is proposed, as a cleaning liquid, an oxidizing agent-containing cleaning liquid capable of removing a residue generated by a dry etching treatment (hereinafter sometimes referred to as "etching residue"), a modified photoresist in which a surface layer part of a photoresist layer has been modified by the dry etching treatment and an unmodified photoresist layer located in a lower layer than the subject modified photoresist by a one-stage process.

Specifically, there are proposed oxidizing agent aqueous solutions such as hydrogen peroxide, ozone water, etc., or cleaning liquids obtained by adding a basic water-soluble fluoride, an amine, quaternary ammonium hydroxide, an acid, a chelating agent, a water-soluble fluorine compound, a quaternary ammonium salt, a surfactant, a solvent or the like to such an oxidizing agent aqueous solution (see JP-A-10-298589, JP-A-2000-56478, JP-A-2000-258924, JP-A-2002-202617, JP-A-2003-5383, JP-A-2003-124173, JP-A-2003-221600 and JP-A-2004-4775).

However, even in the case of using the foregoing cleaning liquid, there are involved such problems that it is difficult to remove the organosiloxane-based thin film and the etching residue as well as the modified photoresist and the unmodified photoresist layer without damaging the copper wiring and the Low-k film and so on and that the use for a long time or the storage over a long period of term is difficult.

Furthermore, the foregoing patent documents neither describe nor suggest a cleaning liquid which is suitable for flattening and the dual damascene process using an antireflection film or a thin film for precise microfabrication (for example, an organosiloxane-based thin film) and a cleaning method thereof.

As a cleaning liquid capable of removing the modified photoresist and the unmodified photoresist layer, JP-A-2004-212818 proposes a cleaning liquid having a pH of 5 or more and containing hydrogen peroxide and an alkali metal ion. However, even the subject patent document neither describes nor suggests a cleaning liquid which is suitable for the dual damascene process using an organosiloxane-based thin film and a cleaning method thereof.

DISCLOSURE OF THE INVENTION

Problems That the Invention is to Solve

The present invention provides a cleaning composition capable of stably removing an organosiloxane-based thin film, an etching residue, a modified photoresist and an unmodified photoresist layer without corroding a Low-k film, copper or a copper alloy in manufacturing a semiconductor device having a Low-k film. Also, the present invention provides a method for manufacturing a semiconductor device using the subject cleaning composition.

Means For Solving the Problems

In order to solve the foregoing problems, the present inventors made extensive and intensive investigations. As a result, it has been found that in manufacturing a semiconductor device having a Low-k film, by carrying out a cleaning treatment with a cleaning composition having strictly regulated prescribed concentrations of hydrogen peroxide, an amino polymethylene phosphonic acid and potassium hydroxide and having a specified pH range, an organosiloxane-based thin film, an etching residue, a modified photoresist and an unmodified photoresist layer can be stably removed without corroding a Low-k film, copper or a copper alloy, leading to accomplishment of the present invention.

That is, the present invention is concerned with a cleaning composition of a semiconductor device for laminating an organosiloxane-based thin film and a photoresist layer in this order on a substrate having a low dielectric interlayer insulation film and a copper wiring or a copper alloy wiring, then applying selective exposure and development treatments to the subject photoresist layer to form a photoresist pattern, subsequently applying a dry etching treatment to the organosiloxane-based thin film and the low dielectric interlayer insulation film while using this resist pattern as a mask and then removing the organosiloxane-based thin film, a residue generated by the dry etching treatment, a modified photoresist having been modified by the dry etching treatment and an unmodified photoresist layer located in a lower layer than the modified photoresist, the cleaning composition containing from 15 to 20% by mass of hydrogen peroxide, from 0.0001 to 0.003% by mass of an amino polymethylene phosphonic acid, from 0.02 to 0.5% by mass of potassium hydroxide and water and having a pH of from 7.5 to 8.5.

Also, the present invention is concerned with a method for manufacturing a semiconductor device, which comprises laminating an organosiloxane-based thin film and a photoresist layer in this order on a substrate having a low dielectric interlayer insulation film and a copper wiring or a copper alloy wiring, then applying selective exposure and development treatments to the photoresist layer to form a photoresist pattern, subsequently applying a dry etching treatment to the organosiloxane-based thin film and the low dielectric interlayer insulation film while using this resist pattern as a mask and then carrying out cleaning with the cleaning composition of the present invention.

According to the cleaning composition of the present invention, even when a copper corrosion inhibitor or a corrosion inhibitor for Low-k film is not used, cleaning and removal operations of an organosiloxane-based thin film, an etching residue, a modified photoresist and an unmodified resist layer can be safely carried out without being accompanied by corrosion of copper, a copper alloy or a Low-k film. Also, the cleaning composition of the present invention is able to exhibit excellent cleaning properties relative to stable use, namely, the continuous use for a long period of time or the use after storage over a long period of term.

Figure 1:
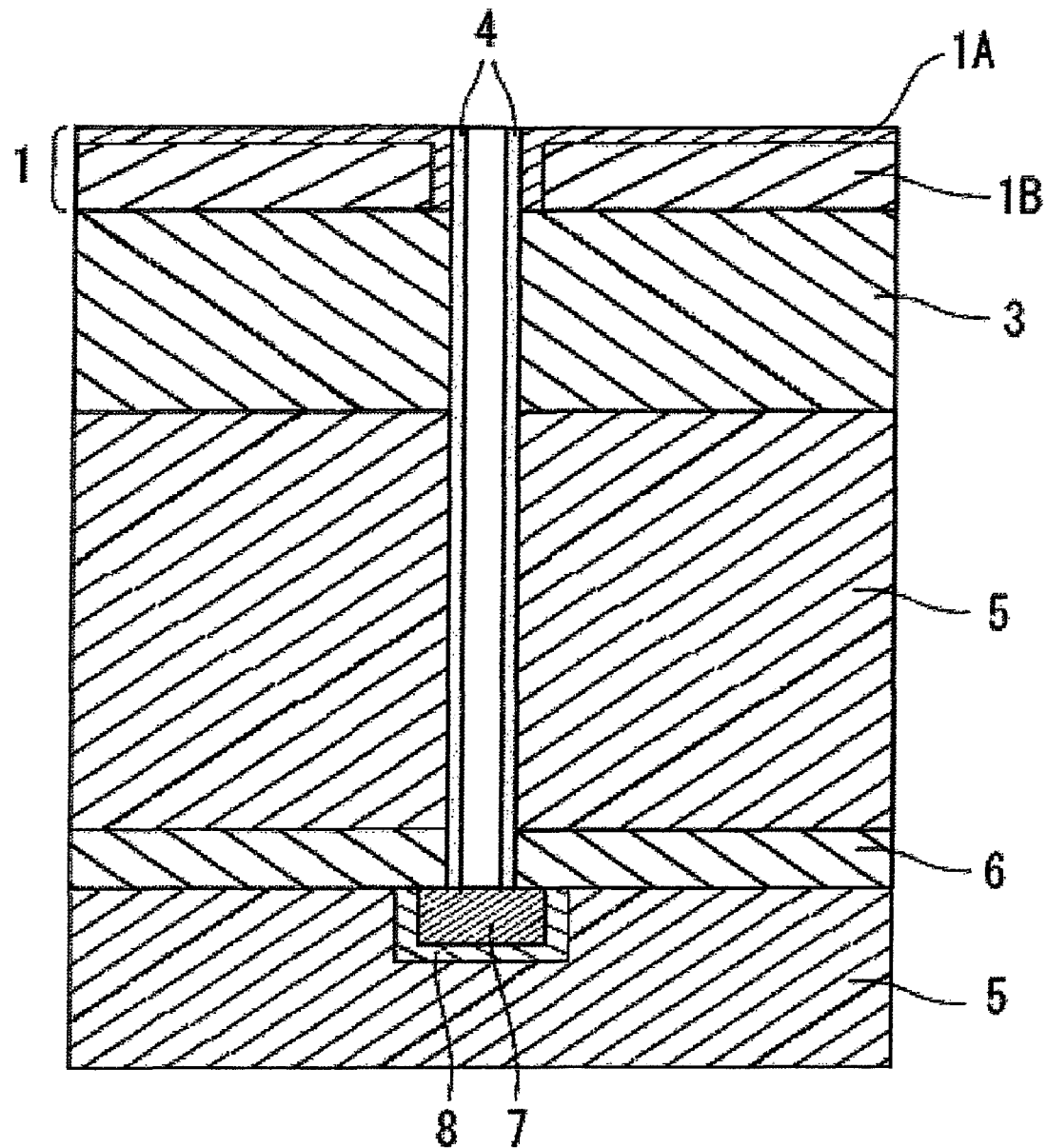
FIG. 1 is a partial sectional view schematically showing a section of a part of a semiconductor device prior to going through a cleaning step.

1: Photoresist layer, 1A: Modified photoresist, 1B: Unmodified photoresist layer, 3: organosiloxane-based thin film, 4: Etching residue, 5: SiOC-based Low-k film, 6: SiC layer, 7: plated copper film, 8: TaN film

BEST MODES FOR CARRYING OUT THE INVENTION (Cleaning Composition)

The cleaning composition of the present invention is one for laminating an organosiloxane-based thin film and a photoresist layer in this order on a substrate having a low dielectric interlayer insulation film and a copper wiring or a copper alloy (for example, an alloy of copper and aluminum) wiring, then applying selective exposure and development treatments to this photoresist layer to form a photoresist pattern, subsequently applying a dry etching treatment to the organosiloxane-based thin film and the low dielectric interlayer insulation film while using this resist pattern as a mask and then removing the organosiloxane-based thin film, an etching residue, a modified photoresist and an unmodified photoresist layer.

The modified photoresist as referred to herein is a layer obtained as a result of the fact that a dry etching treatment is applied to a resist layer, whereby its surface layer is modified and hardened. This modified photoresist is hardly removed as compared with an unmodified photoresist layer which is located on the lower layer side of the modified photoresist and which is not influenced by the dry etching treatment. However, according to the present invention, even such a modified photoresist can be easily removed, too.

Hydrogen peroxide which is used in the cleaning composition of the present invention is used in a concentration of from 15 to 20% by mass. When the concentration of hydrogen peroxide is less than 15% by mass, all of the organosiloxane-based thin film, the etching residue, the modified photoresist and the unmodified photoresist layer cannot be completely removed. When it exceeds 20% by mass, decomposition of hydrogen peroxide in the cleaning liquid becomes large.

Examples of the amino polymethylene phosphonic acid which is used in the present invention include amino tri(methylene phosphonic acid), ethylenediamine tetra(methylene phosphonic acid), diethylenetriamine penta(methylene phosphonic acid), 1,2-propylenediamine tetra(methylene phosphonic acid), etc. Of these, diethylenetriamine penta(methylene phosphonic acid) and 1,2-propylenediamine tetra (methylene phosphonic acid) are especially preferable.

A content of the amino polymethylene phosphonic acid is from 0.0001 (1 ppm) to 0.003 (30 ppm) % by mass. When the content of the amino polymethylene phosphonic acid is less than 0.0001% by mass (1 ppm), decomposition of hydrogen peroxide becomes large, whereas when it exceeds 0.003% by mass (30 ppm), corrosion is generated in copper or the copper alloy, and therefore, it is necessary to strictly control the concentration.

The subject potassium hydroxide is used in a concentration of from 0.02 to 0.5% by mass. When the concentration of potassium hydroxide is less than 0.02% by mass, removal properties of the organosiloxane-based thin film, the etching residue and the unmodified photoresist layer are lowered; whereas when it exceeds 0.5% by mass, damage against the Low-k film or corrosion of copper or the copper alloy is generated, and furthermore, decomposition of hydrogen peroxide becomes large.

Also, a pH of the cleaning composition of the present invention is from 7.5 to 8.5. When the pH of the cleaning composition is less than 7.5, removal properties of the organosiloxane-based thin film, the etching residue and the modified photoresist layer are lowered; whereas when it exceeds 8.5, there is a concern that damage against the Low-k film or copper corrosion is generated, and furthermore, decomposition of hydrogen peroxide becomes large.

In the light of the above, the present invention is able to safely carry out the cleaning and removal operations of an organosiloxane-based thin film, an etching residue, a modified photoresist and an unmodified photoresist layer as an object of the present invention without being accompanied by corrosion of copper or a copper alloy even by not using a copper corrosion inhibitor within a low and extremely restricted concentration range. Also, the present invention is able to realize stable use.

The amount of sodium as an impurity in the cleaning composition is preferably not more than 0.1 ppm, more preferably not more than 0.05 ppm, and further preferably not more than 0.03 ppm. Since sodium in the foregoing potassium hydroxide is an unavoidable impurity, it is actually contained in an amount of about 0.001 ppm in the cleaning composition.

Examples of a material to be treated, for which the cleaning composition of the present invention is used, include silicon, amorphous silicon, polysilicon; Low-k films including hydroxy silsesquioxane (HSQ) based "OCD T-1" and "OCD T-3" (trade names, all of which are manufactured by Tokyo Ohka Kogyo Co., Ltd.), methyl silsesquioxane (MSQ) based "OCD T-31" and "OCD T-39" (trade names, all of which are manufactured by Tokyo Ohka Kogyo Co., Ltd.), carbon doped silicon oxide (SiOC) based "Black Diamond 2" (a trade name, manufactured by Applied Materials), "Aurora 2.7" and "Aurora 2.4" (trade names, manufactured by ASM International) and "Coral" (a trade name, manufactured by Novellus Systems), inorganic "Orion 2.8 to 2.2" (trade names, manufactured by Trikon Technologies); and semiconductor wiring materials such as copper, an alloy of copper and aluminum, silicon oxide, silicon nitride, tantalum, a tantalum compound, chromium, chromium oxide, a chromium alloy, etc. or semiconductor devices having applied thereto a compound semiconductor such as gallium-arsenic, gallium-phosphorus, indium-phosphorus, etc., or the like. These materials are not corroded by the cleaning composition of the present invention.

Also, the foregoing cleaning composition of the present invention can be suitably used for the manufacturing method of a semiconductor device of the present invention, in particular, in the cleaning step for removing an organosiloxane-based thin film, an etching residue, a modified photoresist and an unmodified photoresist layer.

(Manufacturing Method of Semiconductor Device)

The manufacturing method of a semiconductor device of the present invention includes a step of laminating an organosiloxane-based thin film and a photoresist layer in this order on a substrate having a low dielectric interlayer insulation film and a copper wiring or a copper alloy wiring; a step of applying selective exposure and development treatments to this photoresist layer to form a photoresist pattern; and a step of applying a dry etching treatment to the organosiloxane-based thin film and the low dielectric interlayer insulation film while using this resist pattern as a mask, and further includes a cleaning step of, after the step of applying a dry etching treatment, removing the organosiloxane-based thin film, the etching residue, the modified photoresist and the unmodified photoresist layer with the cleaning composition of the present invention.

As described previously, since the cleaning composition of the present invention does not damage the Low-k film or the like, the manufacturing method of a semiconductor device using the subject cleaning composition according to the present invention can be applied to the manufacture of a semiconductor device in which a Low-k film is used (for example, a dual damascene process). Also, since potassium hydroxide is used, the content of sodium as an impurity in the cleaning composition is limited, and with respect to a semiconductor device to be manufactured, a lowering of the semiconductor characteristic to be caused due to the presence of sodium can be prevented.

In the foregoing cleaning step, the temperature at the time of cleaning in using the cleaning composition of the present invention is preferably from 10 to 90° C., and more preferably from 25 to 80° C. and may be properly selected depending upon an etching condition or a used material to be treated. Then, the treatment time in using the cleaning composition is preferably from one minute to 60 minutes, and more preferably from 3 minutes to 50 minutes and may be properly selected depending upon an etching condition or a used material to be treated.

In cleaning using the cleaning composition, ultrasonic waves can be used jointly as the need arises. As to rinse after removing the modified photoresist, the unmodified photoresist layer, the etching residue and the like on the material to be treated, though an organic solvent such as alcohols can be used, it is sufficient to achieve the rinse only with water.

Next, the present invention is hereunder specifically described with reference to the Examples and Comparative Examples. However, it should be construed that the present invention is not limited at all by these Examples.

FIG. 1 shows a partial sectional view of a semiconductor device prior to going through a cleaning step, as prepared by the following method.

First of all, in a wiring groove formed in an SiOC-based Low-k film (5), a TaN film (8) which is a copper diffusion preventing film/barrier film for the side face and bottom face of a copper wiring was fabricated by a sputtering process, and furthermore, a copper seed film which is necessary for plating copper was also fabricated on the TaN film (8) by a sputtering process (not illustrated). Subsequently, a plated copper film (7) was laminated by an electrolytic plating process, and thereafter, an excessive portion was removed and flattened by a CMP (chemical mechanical polishing) process. An SiC layer (6) as an etching stopper film/diffusion preventing film for an upper part of copper wiring was laminated on its flattened substrate, and an SiOC-based Low-k film (5) was further laminated on an upper layer thereof, respectively by means of CVD. An organosiloxane-based thin film (3) as an antireflection film or mask for precise microfabrication was deposited on these layers, and subsequently, a positive type photoresist was spin coated and heated, thereby laminating a photoresist layer (1) thereon. This photoresist was subjected to a selective exposure treatment, a post exposure baking treatment and then a development treatment with a tetramethylammonium hydroxide aqueous solution, thereby forming a photoresist pattern. Then, a dry etching treatment with a halogen-based etching gas was applied while using this resist pattern as a mask, thereby forming a via hole reaching the copper layer through the organosiloxane-based thin film and the Low-k film. A surface layer part of the photoresist layer (1) after this dry etching treatment was modified and hardened by the dry etching treatment, whereby a modified photoresist (1A) was formed. A photoresist part which was not influenced by the dry etching treatment (unmodified photoresist layer (1B)) remained in a lower layer of the modified photoresist (1A). Furthermore, an etching residue (4) was deposited on the side wall of the via hole.

EXAMPLES 1 to 6 AND COMPARATIVE EXAMPLES 1 to 5

The semiconductor device shown in FIG. 1 was cleaned with each of cleaning compositions shown in the following Tables 1 and 2 under a treatment condition shown in the tables, rinsed with ultra-pure water and then dried by means of $N_2$ blowing, thereby completing a semiconductor device.

Thereafter, a cross-section was observed by a scanning electron microscope (Hitachi's field emission scanning electron microscope, S-4700), and removal properties of the modified photoresist, the unmodified photoresist layer, the organosiloxane-based thin film and the etching residue after dry etching and corrosiveness of copper and the SiOC-based Low-k film were evaluated according to the following determination criteria. The results were shown in the following Table 1 (Examples 1 to 6) and Table 2 (Comparative Examples 1 to 5). The pH of the cleaning composition was measured by HORIBA's "pH METER F-12".

The evaluation criteria are as follows.

=Evaluation of Removal Properties=

A: Completely removed.

B: Though the modified photoresist, the unmodified photoresist layer and the organosiloxane-based thin film were removed, the etching residue remained without being removed.

C: A part of the organosiloxane-based thin film remained without being removed, and the etching residue remained.

D: The modified photoresist, the unmodified photoresist layer, the organosiloxane-based thin film and the etching residue remained.

=Evaluation of Corrosiveness=

A: Corrosion was not observed at all.
B: Corrosion was slightly observed in at least one material of copper and the SiOC-based Low-k film.
C: Corrosion was significantly observed in at least one material of copper and the SiOC-based Low-k film.

EXAMPLE 7 AND COMPARATIVE EXAMPLES 6 to 8

Each of cleaning compositions shown in Table 3 was heated in a constant temperature water bath at 70° C. for 24 hours, thereby evaluating the stability of hydrogen peroxide in the cleaning liquid. Specifically, a concentration of hydrogen peroxide before and after heating was measured by a potentiometric titration process (using potassium permanga-

TABLE 1

|  |  |  | Example 1 | Example 2 | Example 3 | Example 4 | Example 5 | Example 6 |
|---|---|---|---|---|---|---|---|---|
| Cleaning liquid composition | Composition and concentration (% by mass) | Hydrogen peroxide | 15 | 16 | 17 | 18 | 20 | 19 |
|  |  | Potassium hydroxide | 0.02 | 0.12 | 0.13 | 0.12 | 0.5 | 0.47 |
|  |  | PDTP | 0.0005 | 0.001 | — | 0.003 | — | 0.0001 |
|  |  | DTPP | — | — | 0.002 | — | 0.003 | — |
|  |  | Water | 84.9795 | 83.879 | 82.868 | 81.877 | 79.497 | 80.5299 |
|  | pH |  | 7.5 | 8.2 | 8.0 | 7.9 | 8.5 | 8.5 |
|  | Na content (ppm) |  | 0.004 | 0.024 | 0.026 | 0.024 | 0.1 | 0.094 |
| Treatment condition | Temperature (° C.) |  | 80 | 70 | 70 | 60 | 50 | 70 |
|  | Time (min) |  | 15 | 30 | 30 | 50 | 40 | 20 |
| Evaluation | Removal properties |  | A | A | A | A | A | A |
|  | Corrosiveness |  | A | A | A | A | A | A |

PDTP: 1,2-Propylenediamine tetra(methylene phosphonic acid)
DTPP: Diethylenetriamine penta(methylene phosphonic acid)

TABLE 2

|  |  |  | Comparative Example 1 | Comparative Example 2 | Comparative Example 3 | Comparative Example 4 | Comparative Example 5 |
|---|---|---|---|---|---|---|---|
| Cleaning liquid composition | Composition and concentration (% by mass) | Hydrogen peroxide | 10 | 15 | 20 | 17 | 5 |
|  |  | Potassium source | Potassium hydroxide 0.02 | Potassium hydroxide 0.006 | Potassium hydroxide 0.7 | Potassium hydroxide 0.13 | Potassium phosphate 0.1 |
|  |  | PDTP | 0.0005 | 0.0005 | — | — | 0.005 |
|  |  | DTPP | — | — | 0.003 | 0.01 | — |
|  |  | Water | 89.9795 | 84.9935 | 79.297 | 82.86 | 94.895 |
|  | pH |  | 7.7 | 6.6 | 8.7 | 8.0 | 8.5 |
|  | Na content (ppm) |  | 0.004 | 0.0012 | 0.14 | 0.026 | 0.056 |
| Treatment condition | Temperature (° C.) |  | 80 | 80 | 50 | 70 | 70 |
|  | Time (min) |  | 15 | 15 | 40 | 30 | 60 |
| Evaluation | Removal properties |  | B | D | A | A | C |
|  | Corrosiveness |  | A | A | B | B | A |

As shown in Table 1, in Examples 1 to 6, the modified photoresist, the unmodified photoresist layer, the organosiloxane-based thin film and the etching residue after dry etching could be completely removed without corroding copper and the SiOC-based Low-k film.

In Comparative Example 1, the removal of the etching residue was incomplete; and in Comparative Example 2, the removal of the modified photoresist, the unmodified photoresist layer, the organosiloxane-based thin film and the etching residue was incomplete.

In Comparative Examples 3 and 4, though the removal properties were good, corrosion was generated in at least one material of copper and the SiOC-based Low-k film.

In Comparative Example 5, the organosiloxane-based thin film could not be substantially removed but remained considerably without being removed. It may be considered to be that this was caused due to a primary factor that potassium phosphate was used in place of potassium hydroxide.

nate), and a rate of decomposition of hydrogen peroxide of each of the cleaning compositions was calculated from the measured values and evaluated according to the following determination criteria. The rate of decomposition of hydrogen peroxide was obtained according to the following expression.

Expression

Rate of decomposition of hydrogen peroxide (%)=100−[{(Weight of cleaning liquid after heating)×(Concentration of hydrogen peroxide after heating)}/{(Weight of cleaning liquid before heating)×(Concentration of hydrogen peroxide before heating)}×100]

=Evaluation of Stability of Hydrogen Peroxide=

A: The rate of decomposition of hydrogen peroxide is 0% or more and less than 5%.
B: The rate of decomposition of hydrogen peroxide is 5% or more and less than 10%.
C: The rate of decomposition of hydrogen peroxide is 10% or more and less than 20%.
D: The rate of decomposition of hydrogen peroxide is 20% or more.

TABLE 3

| | | | Example 7 | Comparative Example 6 | Comparative Example 7 | Comparative Example 8 |
|---|---|---|---|---|---|---|
| Cleaning liquid composition | Composition and concentration (% by mass) | Hydrogen peroxide | 16 | 25 | 16 | 16 |
| | | Potassium hydroxide | 0.14 | 0.46 | 0.6 | 0.14 |
| | | PDTP | 0.001 | 0.001 | 0.001 | — |
| | | Water | 83.859 | 74.539 | 83.409 | 83.46 |
| | pH | | 8.1 | 8.1 | 8.9 | 8.1 |
| Evaluation | Stability of hydrogen peroxide | | A | C | C | C |

It is noted from Table 3 that the stability (stability of hydrogen peroxide) of the cleaning composition of Example is very high, and therefore, it is expected that even when used for a long time (at the time of use) and over a long period of time (at the time of storage), the modified photoresist, the unmodified photoresist layer, the organosiloxane-based thin film and the etching residue after dry etching can be stably removed well.

The invention claimed is:

1. A cleaning composition of a semiconductor device for laminating an organosiloxane-based thin film and a photoresist layer in this order on a substrate having a low dielectric interlayer insulation film and a copper wiring or a copper alloy wiring, then applying selective exposure and development treatments to said photoresist layer to form a photoresist pattern, subsequently applying a dry etching treatment to the organosiloxane-based thin film and the low dielectric interlayer insulation film while using this resist pattern as a mask and then removing the organosiloxane-based thin film, a residue generated by the dry etching treatment, a modified photoresist having been modified by the dry etching treatment and an unmodified photoresist layer located in a lower layer than the modified photoresist, the cleaning composition containing from 15 to 20% by mass of hydrogen peroxide, from 0.0001 to 0.003% by mass of an amino polymethylene phosphonic acid, from 0.02 to 0.5% by mass of potassium hydroxide and water and having a pH of from 7.5 to 8.5.

2. The cleaning composition according to claim 1, wherein the amino polymethylene phosphonic acid is any one of diethylenetriamine penta(methylene phosphonic acid) and 1,2-propylenediamine tetra(methylene phosphonic acid).

3. The cleaning composition according to claim 1, wherein a content of sodium is from 0.001 to 0.1 ppm.

4. The cleaning composition according to claim 1, wherein the copper alloy is an alloy of copper and aluminum.

5. A method for manufacturing a semiconductor device, which comprises laminating an organosiloxane-based thin film and a photoresist layer in this order on a substrate having a low dielectric interlayer insulation film and a copper wiring or a copper alloy wiring, then applying selective exposure and development treatments to said photoresist layer to form a photoresist pattern, subsequently applying a dry etching treatment to the organosiloxane-based thin film and the low dielectric interlayer insulation film while using this resist pattern as a mask and then carrying out cleaning with a cleaning composition containing from 15 to 20% by mass of hydrogen peroxide, from 0.0001 to 0.003% by mass of an amino polymethylene phosphonic acid, from 0.02 to 0.5% by mass of potassium hydroxide and water and having a pH of from 7.5 to 8.5.

* * * * *